(12) United States Patent
Rao et al.

(10) Patent No.: US 9,715,907 B1
(45) Date of Patent: Jul. 25, 2017

(54) OPTIMAL DATA EYE FOR IMPROVED VREF MARGIN

(71) Applicant: Invecas, Inc., Santa Clara, CA (US)

(72) Inventors: Venkata N. S. N. Rao, Fremont, CA (US); Ravindra Kantamani, Hyderabad (IN); Prasad Chalasani, San Jose, CA (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/150,334

(22) Filed: May 9, 2016

(51) Int. Cl.
*G11C 7/22* (2006.01)
*G11C 11/4076* (2006.01)
*G11C 8/18* (2006.01)
*G11C 7/00* (2006.01)
*G11C 11/4096* (2006.01)
*G11C 5/06* (2006.01)

(52) U.S. Cl.
CPC .......... *G11C 7/00* (2013.01); *G11C 11/4076* (2013.01); *G11C 5/063* (2013.01); *G11C 11/4096* (2013.01); *G11C 2207/2254* (2013.01)

(58) Field of Classification Search
CPC .......... G11C 11/4076; G11C 11/4096; G11C 29/023; G11C 2207/2254; G11C 5/063

USPC ............... 365/193, 233.12; 706/12; 714/702
See application file for complete search history.

(56) References Cited

U.S. PATENT DOCUMENTS

| | | | | |
|---|---|---|---|---|
| 7,443,741 | B2 * | 10/2008 | Butt .................... | G11C 7/1006 365/174 |
| 8,111,784 | B1 * | 2/2012 | Ding .................... | H04L 25/063 327/141 |
| 2010/0332921 | A1 * | 12/2010 | Schaefer ............. | G06F 13/1689 714/702 |
| 2011/0075496 | A1 * | 3/2011 | Mueller .............. | G06F 13/1694 365/193 |
| 2011/0141827 | A1 * | 6/2011 | Mozak ................. | G11C 5/147 365/189.09 |
| 2014/0253208 | A1 * | 9/2014 | Ruberg ................ | H04L 25/028 327/331 |
| 2015/0066819 | A1 * | 3/2015 | Mozak ................. | G05B 13/02 706/12 |
| 2016/0239220 | A1 * | 8/2016 | Yu ...................... | G06F 3/0611 |

* cited by examiner

*Primary Examiner* — Ly D Pham
(74) *Attorney, Agent, or Firm* — Venture Pacific Law, PC

(57) ABSTRACT

An optimized method and apparatus for determining optimal DQS delay for DDR memory interfaces are disclosed. The method performs data eye training in a two dimensional space with time delay value as x-axis and reference voltage (Vref) as y-axis to determine a rectangular data eye within an overall data eye with Vref margin.

10 Claims, 6 Drawing Sheets

OPTIMAL DATA EYE FOR IMPROVED VREF MARGIN

FIELD OF INVENTION

The disclosure generally relates to computing systems, and more particularly to a method for two-dimensional (2D) training for double data rate (DDR) memory data eye training using reference voltages (Vrefs) and signal timing.

BACKGROUND

Electrical circuits and devices that execute instructions and process data have evolved becoming faster, larger and more complex. With the increased speed, size, and complexity of electrical circuits and data processors, data eye training has become more problematic, particularly in Double Data Rate (DDR) memory systems. As technologies for electrical circuits and processing devices have progressed, there has developed a greater need for efficiency, reliability and stability, particularly in the area of DDR memory data eye training.

Double Data Rate (DDR) memory devices use source synchronous clocking protocol to transfer the data between Memory and PHY. A DDR PHY or PHY is a DDR physical interface to DDR memory devices and drives address, command, and data pins of the memory device. The PHY acts as an interface between a memory controller and memory device to perform read/write data operations. The PHY can also perform various memory trainings to configure the PHY internal delay as well as some memory parameters to make sure memory read and write transactions are performed correctly. The double data rate architecture transfers two data words per clock cycle on the interface pins. In a typical DDR SDRAM, a bi-directional differential data strobe (DQS/DQS#) signal is sent externally, along with the data (DQ) signal. The DQS/DQS# signal is used to capture the DQ signal at the receiver. For Memory Write operation, PHY sends DQS/DQS# signal at the center of DQ, so write data can be captured properly at the memory. For Read operation, memory drives DQS/DQS# signal at the same time as DQ signal, and PHY delays the read DQS signal to place the DQS edges at the center of the DQ signal to effectuate proper capture the read data.

The DQ and DQS signal timing may be different at the receive end with respect to the transmit side due to mismatches between the DQ and DQS signal paths. The PHY performs required trainings to adjust the delay on DQS signal for both write and read operations to center align the DQS signal with respect to the DQ signal in order to have reliable data capture.

Current method to align DQS at the center of DQ is to perform a data eye training that detects extreme left and right points on data eye window for each Vref value. PHY compares the eye width for each Vref and selects the best Vref value that has the largest data eye width. The delay on DQS signal is selected to keep DQS edge in the middle of the data eye of the best Vref value.

This method provides best data eye width for a particular Vref value but does not guarantee required Vref margin. Vref margin refers to the amount of variation in Vref value with which reliable data transfers are guaranteed. Methods that try to detect the data eye width for a particular Vref and set the DQS delay in the middle work well but do not put the DQS signal in the broadest part of the eye.

For the foregoing reasons, there is a need for new methods and apparatuses for data eye training that overcome the problem associated with maximizing data eye width without taking into account of Vref margin in optimizing data eye training.

SUMMARY OF INVENTION

Briefly, the disclosure relates to optimizing data eye training with Vref voltage margin. Accordingly, the data eye training for a DDR interface includes calculating a DQS delay that provides optimal data width and optimal Vref margin.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

Figure 1:
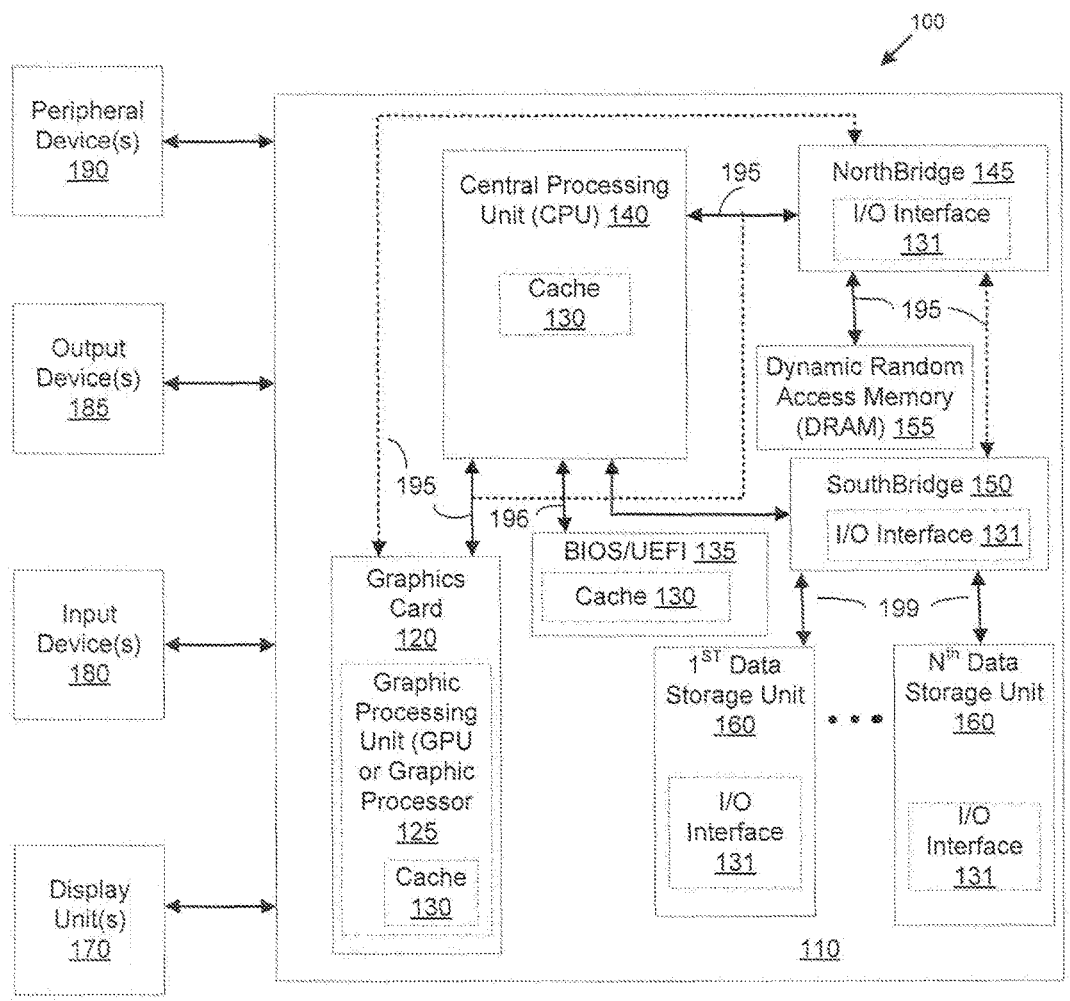
FIG. 1 illustrates a block diagram of a computer system in accordance to an embodiment of the present invention.

In the following detailed description of the embodiments, reference is made to the accompanying drawings, which form a part hereof, and in which is shown by way of illustration of specific embodiments in which the disclosure may be practiced.

As used herein, the suffixes "#", "_b" and "_n" (or "b" and "n") denote a signal that is active-low (i.e., the signal is activated or enabled when a logical '0' is applied to the signal). Signals not having these suffixes may be active-high (i.e., the signal is activated or enabled when a logical '1' is applied to the signal). While various embodiments and Figures herein are described in terms active-high and active-low signals, it is noted that such descriptions are for illustrative purposes of various embodiments and that alternate configurations are contemplated in other embodiments not explicitly described in this disclosure.

Embodiments presented herein relate to reference voltage (Vref) training for broadest data eye in DDR memories. Vref training may be performed at system boot (e.g., when booting a computer such as computer system 100, described below) by a basic input/output system (BIOS), a unified extensible firmware interface (UEFI) and/or the like. Vref training may be used to place a memory data strobe within the data eye for a given memory cycle. Vref training may also be used to adjust an operating Vref for the DDR memory. That is, Vref training, as described herein, may be performed by way of a two-dimensional analysis in the time and voltage domains. By performing such a two-dimensional analysis, it may be possible to adjust and/or select the operating Vref(s) for a DDR memory by making tradeoffs between optimized timing and Vref voltage margins to determine a broadest data eye. It is noted that the Vref training may occur on a byte lane by byte lane basis, on a rank by rank basis, on a channel by channel basis, or across all byte lanes, in various embodiments. It is also noted that while the embodiments described herein may be referred to in terms of memory cycles, read cycles and/or write cycles, the described embodiments are not thus limited and may be applied to read and write cycles equally.

DDR memory training may be accomplished on a per channel, per rank, and/or per lane basis. In alternate embodiments, other groupings of data (e.g., per bit) may be used. As an example, for each rank pair on a dual-rank or quad-rank dual inline memory module (DIMM), the BIOS/UEFI may use the per-lane mutual passing delay values of each rank to calculate the optimal delay values. The BIOS/UEFI may use the mutual passing voltage values across all ranks and all lanes of the channel to calculate the desired Vref setting.

DDR memory training may involve interactions among all the populated channels of a processor. The channel currently being trained will be called the victim channel herein, and all other channels will be called aggressor channels for purposes of this description. Read training, or training of memory read cycles, may take place after timing delays for write data and write data strobe signals have been determined for all channels/lanes. Similarly, write training, or training of memory write cycles, may take place after timing delays for read data and read data strobe signals have been determined for all channels/lanes. In some embodiments, the DDR memory training may be an iterative process. For example, if read cycles have been previously trained, and write cycles are subsequently trained, the write cycle training may affect the bus signaling such that the read cycles may require additional training. In one embodiment, write cycle training may be performed before read cycle training.

Turning now to FIG. 1, a block diagram of an exemplary computer system 100, in accordance with an embodiment of the present application, is illustrated. In various embodiments the computer system 100 may be a personal computer, a laptop computer, a handheld computer, a tablet computer, a mobile device, a telephone, a personal data assistant ("PDA"), a server, a mainframe, a work terminal, a music player, and/or the like. The computer system includes a main structure 110 which may be a computer motherboard, circuit board or printed circuit board, a desktop computer enclosure and/or tower, a laptop computer base, a server enclosure, part of a mobile device, personal data assistant (PDA), or the like. In one embodiment, the main structure 110 includes a graphics card 120. The graphics card 120 may be any graphics card using memory. The graphics card 120 may, in different embodiments, be connected on a Peripheral Component Interconnect "(PCI") Bus (not shown), PCI-Express Bus (not shown) an Accelerated Graphics Port ("AGP") Bus (also not shown), or any other computer system connection. It should be noted that embodiments of the present application are not limited by the connectivity of the graphics card 120 to the main computer structure 110. In one embodiment, the computer system 100 runs an operating system such as Linux, UNIX, Windows, Mac OS, and/or the like. In one or more embodiments, the computer system 100 may include one or more system registers (not shown) adapted to store values used by the computer system 100 during various operations.

In one embodiment, the graphics card 120 may contain a processing device such as a graphics processing unit (GPU) 125 used in processing graphics data. The GPU 125, in one embodiment, may include one or more embedded memories, such as one or more caches 130. The GPU caches 130 may be L1, L2, higher level, graphics specific/related, instruction, data and/or the like. In various embodiments, the embedded memory(ies) may be an embedded random access memory ("RAM"), an embedded static random access memory ("SRAM"), or an embedded dynamic random access memory ("DRAM"). In alternate embodiments, the embedded memory(ies) may be embedded in the graphics card 120 in addition to, or instead of, being embedded in the GPU 125. In various embodiments the graphics card 120 may be referred to as a circuit board or a printed circuit board or a daughter card or the like.

In one embodiment, the computer system 100 includes a processing device such as a central processing unit ("CPU") 140, which may be connected to a northbridge 145. In various embodiments, the CPU 140 may be a single- or multi-core processor, or may be a combination of one or more CPU cores and a GPU core on a single die/chip. In one embodiment, the CPU 140 may include one or more cache memories 130, such as, but not limited to, L1, L2, level 3 or higher, data, instruction and/or other cache types. In one or more embodiments, the CPU 140 may be a pipe-lined processor. The CPU 140 and northbridge 145 may be housed on the motherboard (not shown) or some other structure of the computer system 100. It is contemplated that in certain embodiments, the graphics card 120 may be coupled to the CPU 140 via the northbridge 145 or some other computer system connection. For example, CPU 140, northbridge 145, GPU 125 may be included in a single package or as part of a single die or "chips" (not shown). Alternative embodiments which alter the arrangement of various components illustrated as forming part of main structure 110 are also contemplated. In certain embodiments, the northbridge 145 may be coupled to a system RAM (or DRAM) 155. In other embodiments, the system RAM 155 may be coupled directly to the CPU 140. The system RAM 155 may be of any RAM type known in the art and may comprise one or more memory modules; the type of RAM 155 does not limit the embodiments of the present application. For example, the RAM 155 may include one or more DIMMs. As referred to in this description, a memory may be a type of RAM, a cache or any other data storage structure referred to herein. In one embodiment, the northbridge 145 may be connected to a southbridge 150. In other embodiments, the northbridge 145 and southbridge 150 may be on the same chip in the computer system 100, or the northbridge 145 and southbridge 150 may be on different chips. In one embodiment, the southbridge 150 may have one or more I/O interfaces 131, in addition to any other I/O interfaces 131 elsewhere in the computer system 100. In various embodiments, the southbridge 150 may be connected to one or more data storage units 160 using a data connection or bus 199. The data storage units 160 may be hard drives, solid state drives, magnetic tape, or any other writable media used for storing data. In one embodiment, one or more of the data storage units may be USB storage units and the data connection 199 may be a USB bus/connection. Additionally, the data storage units 160 may contain one or more I/O interfaces 131. In various embodiments, the central processing unit 140, northbridge 145, southbridge 150, graphics processing unit 125, DRAM 155 and/or embedded RAM may be a computer chip or a silicon-based computer chip, or may be part of a computer chip or a silicon-based computer chip. In one or more embodiments, the various components of the computer system 100 may be operatively, electrically and/or physically connected or linked with a bus 195 or more than one bus 195.

In one or more embodiments, the computer system 100 may include a basic input/output system (BIOS) and/or unified extensible firmware interface (UEFI) 135. In one embodiment, the BIOS/UEFI may include a read-only memory (ROM) and/or one or more caches 130 as described above. For example, the BIOS/UEFI 135 may include an L1 cache and an L2 cache in some embodiments. The BIOS/UEFI 135 may comprise a silicon die/chip and include software, hardware or firmware components. In different embodiments, the BIOS/UEFI 135 may be packaged in any silicon die package or electronic component package as would be known to a person of ordinary skill in the art having the benefit of this disclosure. In alternate embodiments, the BIOS/UEFI 135 may be programmed into an existing computer component. In one embodiment, the BIOS/UEFI may reside on the motherboard 110 and be communicatively coupled to the CPU 140 via connection 196, as shown in FIG. 1. The BIOS/UEFI 135 may include a CPU interface associated with the connection 196. The BIOS/UEFI 135 may be adapted to execute a DDR Vref training algorithm and/or state machine within the CPU 140, in one or more embodiments and as discussed in further detail below. As used herein, the term BIOS/UEFI (e.g., the BIOS/UEFI 135) may be used to refer the physical BIOS/UEFI chip, to circuitry on the BIOS/UEFI 135 chip, or to the functionality implemented by the BIOS/UEFI. In accordance with one or more embodiments, the BIOS/UEFI may function as, and/or be referred to as, a processing device. In some embodiments, some combination of the GPU 125, the CPU 140, the BIOS/UEFI 135 and/or any hardware/software units respectively associated therewith, may collectively function as, and/or be collectively referred to as, a processing device. For example, in one embodiment, the CPU 140, the BIOS/UEFI 135 and their respective caches 130 and interconnects may function as a processing device.

In different embodiments, the computer system 100 may be connected to one or more display units 170, input devices 180, output devices 185 and/or other peripheral devices 190. It is contemplated that in various embodiments, these elements may be internal or external to the computer system 100, and may be wired or wirelessly connected, without affecting the scope of the embodiments of the present application. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to corresponding physical digital media, a universal serial bus ("USB") device, Zip Drive, external floppy drive, external hard drive, phone and/or broadband modem, router/gateway, access point and/or the like. The input, output, display and peripheral devices/units described herein may have USB connections in some embodiments. To the extent certain exemplary aspects of the computer system 100 are not described herein, such exemplary aspects may or may not be included in various embodiments without limiting the spirit and scope of the embodiments of the present application as would be understood by one of skill in the art.

Figure 2:
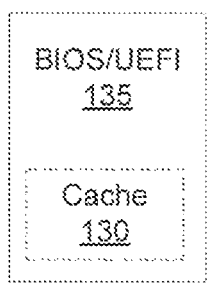
FIG. 2 illustrates a simplified block diagram of a BIOS/IEFI that includes a cache in accordance to an embodiment of the present invention.

Turning now to FIG. 2, a block diagram of an exemplary BIOS/UEFI 135, in accordance with an embodiment of the present application, is illustrated. In one embodiment, the BIOS/UEFI 135 may contain one or more cache memories 130. The BIOS/UEFI 135, in one embodiment, may include L1, L2 or other level cache memories 130. In one embodiment, the BIOS/UEFI 135 may be adapted to execute a state machine and/or an algorithm in the CPU 140 to perform one or more types of DDR training (e.g., DDR Vref training). The one or more cache memories 130, such as those that may be included in the BIOS/UEFI 135 for example, may be adapted to store and/or facilitate execution of the training state machine and/or algorithm(s). To the extent certain exemplary aspects of the BIOS/UEFI 135 and/or one or more cache memories 130 are not described herein, such exemplary aspects may or may not be included in various embodiments without limiting the spirit and scope of the embodiments of the present application as would be understood by one of skill in the art.

Figure 3:
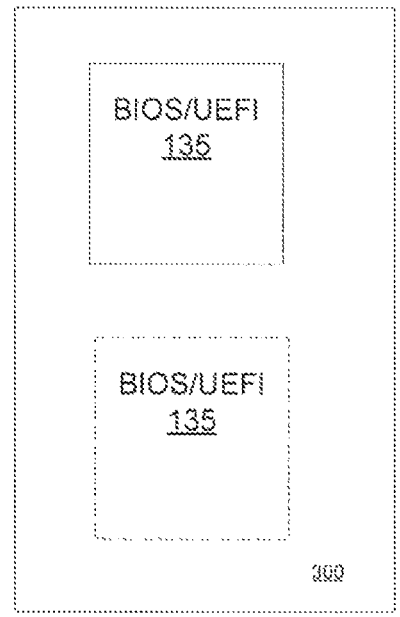
FIG. 3 illustrates a silicon chip/die that includes one or more BIOS/UFEI.

Turning now to FIG. 3, in one embodiment, the BIOS/UEFI 135 and the cache(s) 130 may reside on a silicon chips/die 300 and/or in the computer system 100 components such as those depicted in FIG. 1. The silicon chip(s) 300 may be housed on the motherboard (e.g., 110) or other structure of the computer system 100. In one or more embodiments, there may be more than one BIOS/UEFI 135 and/or cache memory 130 on each silicon chip/die 300. As discussed above, various embodiments of the BIOS/UEFI 135 may be used in a wide variety of electronic devices.

Figure 4:
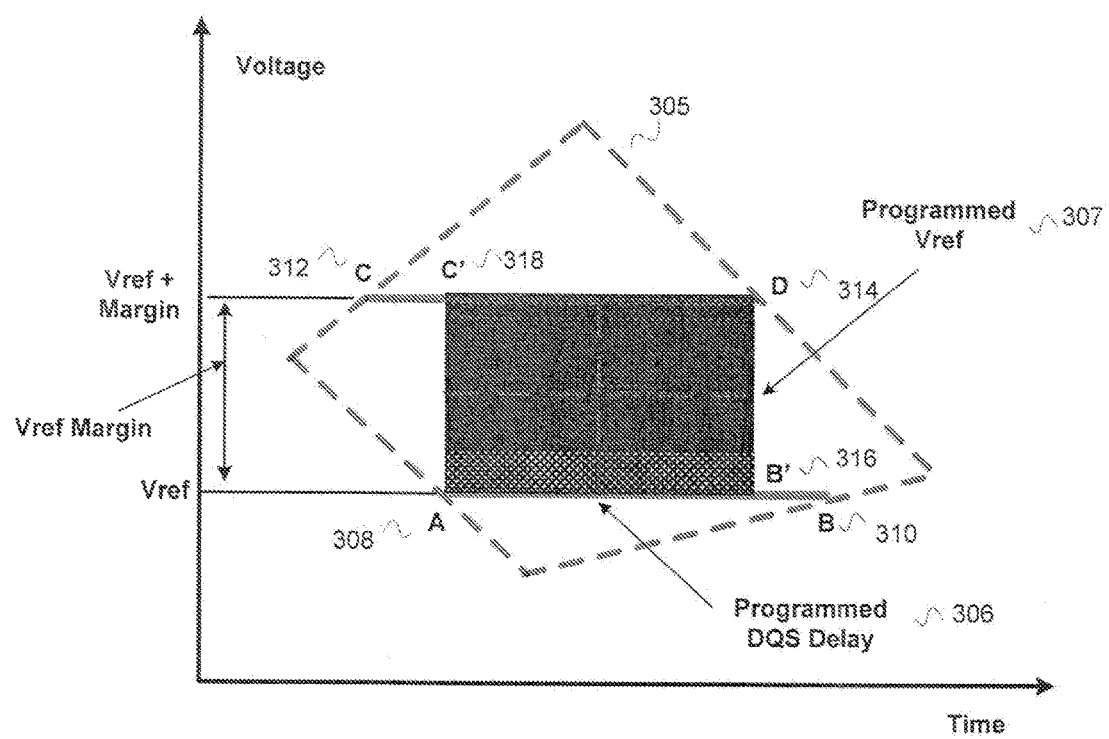
FIG. 4 illustrates a simplified PHY Data Macro DDR memory training schematic in accordance to an embodiment of the present invention.

FIG. 4 illustrates a graphical diagram of an exemplary rectangular data eye within an overall data eye that has optimal eye width and Vref Margin in accordance to an embodiment of the present invention. Data eye 305 depicted by dashed lines represent a closed polygon defined in a two dimensional space with the delay value as the x-axis and the reference voltage Vref as the y-axis. Any point within the data eye 305 represents a combination of Data Strobe (DQS) delay value and reference voltage (Vref) that results in valid data while points outside of the data eye 305 result in invalid data. Rectangular data eye represented by reference "A" 308, reference "B" 316, reference "C" 318, and reference "D" 314" has optimal eye width and Vref Margin for the overall data eye 305. Stated differently, the irregularly shaped overall data eye 305 is reconfigured to represent a rectangular data eye "A" 308, "B" 316, "C" 318 and "D" 314 with optimized data eye width and Vref Margin that will fit within the overall data eye 305. Optimal delay for programmed DQS delay 306 is set such that a rising or falling edge of delayed DQS occurs in a portion of the data eye 305 that has the most Vref margin as well as the most data eye width. Optimal Programmed Vref 307 is centered at a midpoint value of Vref+Vref Margin/2. The Vref Margin is typically provided by the respective memory protocol.

Figure 5:
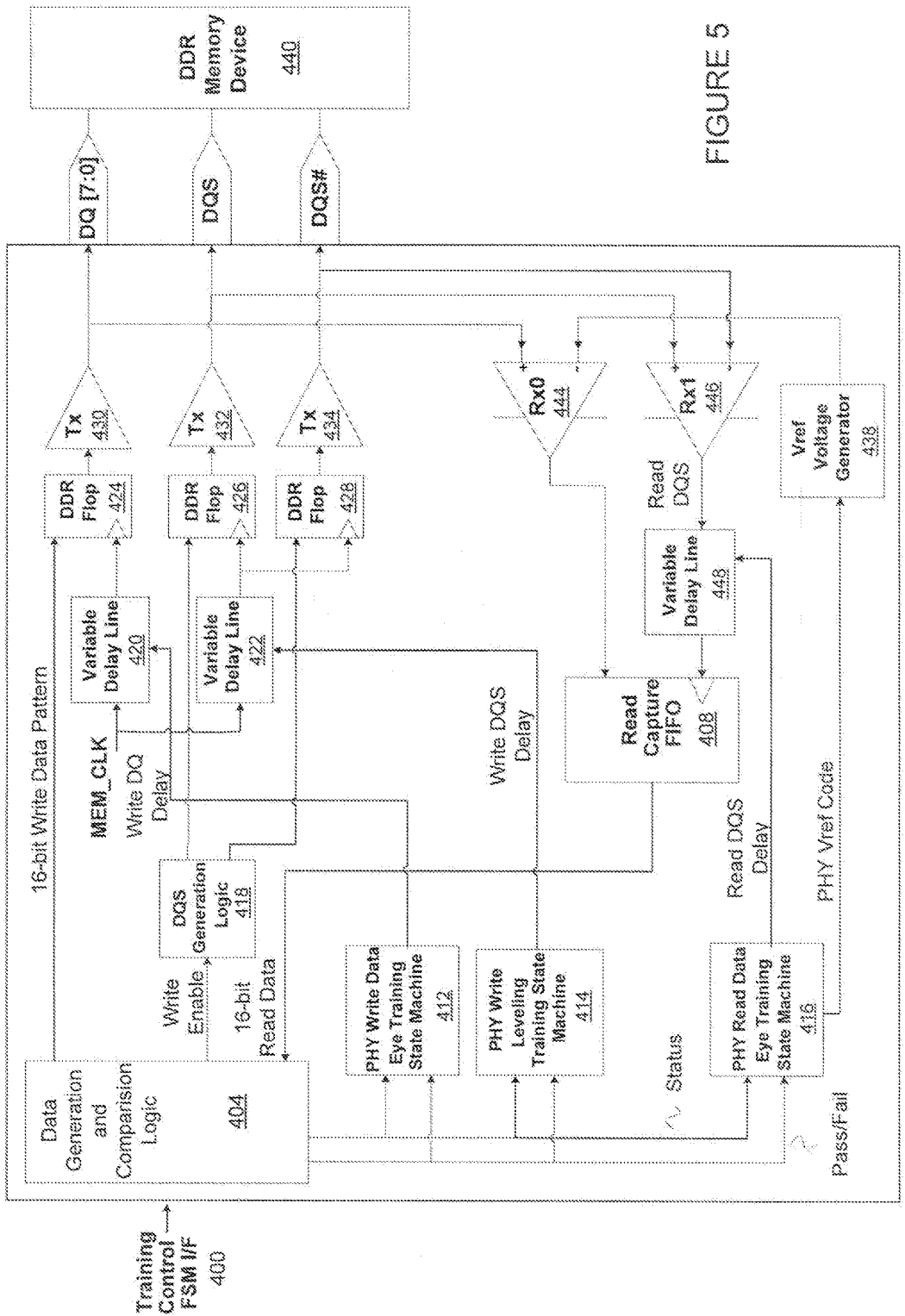
FIG. 5 illustrates a graphical diagram of a data eye for a memory cycle used in conjunction with DDR memory training in accordance to an embodiment of the present invention.

FIG. 5 illustrates a simplified PHY Data Macro training logical diagram for DDR memory training in accordance to an embodiment of the present invention. The PHY Data Macro drives a single byte of memory data to a DDR Memory device. Additional PHY Data Macros can be added depending on desired memory bus width. Training Control FSM 400 sends Read/Write commands using a memory address, command interface to perform DDR memory trainings and commands Data Generation and Comparison Logic 404 when to drive write data or receive read data during DDR memory training. The Data Generation and Comparison Logic 404 generates a 16-bit width write data pattern and write data enable to the write data path of DDR Memory Device 440. The Data Generation and Comparison Logic 404 also includes logic to compare read data from Read Capture FIFO 408 when the read data is received from the DDR Memory Device 440. Depending on a comparison of the read data, the Data Generation and Comparison Logic 404 generates a PASS/FAIL status to a PHY training state machine 412, 414, 416 (depending on whether a training is based on a PHY Write Data Eye Training, a PHY Write Leveling Training, or a PHY Read Data Eye Training).

DQS Generation Logic 418 is coupled to input/outputs DQS and DQS# that can be bi-directional differential pins. For example, during a write command, PHY drives the DQS and DQS# in the middle of DQ[7:0] bus. Recall, DDR memory devices requires a pre-amble on DQS and DQS# strobe prior to the first latching edge of Data [7:0] (DQ[7:0]), and requires a post-amble after the last latching edge of DQ[7:0]. The DQS Generation logic provides proper timing to drive the DQS and DQS# data to meet timing requirements for memory pre-amble and post-amble lengths. Variable Delay Lines 420 and 422 supply step delays and can be programmed up to the granularity of around $\frac{1}{128}^{th}$ of a clock cycle period. Accordingly, the amount of delay is selectable through an input such as Write DQ Delay. Depending on the Write DQ Delay, the Variable Delay Lines' 420 and 422 output clock are delayed in response to the Write DQ Delay input.

DDR Flops 424, 426, and 428 receive EVEN, ODD data inputs and drive EVEN data on rising edge of the clock and ODD data on falling edge of the clock. Both EVEN/ODD data are transmitted in the same clock cycle to the output DQ[7:0], DQS, and DQS# via transmit drivers Tx 430, 432, and 434. VREF Voltage Generator 438 generates a Vref voltage level based on a PHY Vref Code. The PHY Read DATA Eye Training State Machine 416 sends the PHY Vref Code to set the Vref voltage which is a reference DC voltage that is typically set between a high input voltage (VIH) and a low input voltage (VIL). As discussed earlier, Tx 430, 432, and 434 are output drivers that drive DDR Flops 424, 426, and 428 output data onto Bi-Directional IO pins DQ[7:0], DQS, and DQS# of the DDR Memory Device 440 at a DDR Memory Device IO pin voltage level (VDDIO). Rx0 444 receives DQ data at VDDIO level and level shifts the DQ data to a PHY internal voltage level (VDDR). The incoming DQ signal level is compared with Vref voltage value from the Vref Voltage Generator 438 for determining whether the input signal is at a high level or a low level. Rx1 446 is a differential receiver coupled to DQS and DQS#. Upon receiving DQS and DQS# data at VDDIO level, Rx1 446 generates a single ended Read DQS output at a PHY internal voltage level (VDDR). The Read Capture FIFO 408 captures receive DQ[7:0] data using a delayed Read DQS clock via Variable Delay Line 448 and stores the data internally. The Read Capture FIFO 408 captures receive DQ[7:0] data on both edges of Read DQS clock to sample EVEN/ODD data. The sampled Read EVEN/ODD data has a 16-bit width and is sent to the Data Generation and Comparison Logic 404.

Referring back to the PHY Eye Training State Machines 412, 414, and 416, and in particular, PHY Write Leveling Training State Machine 414 which trains the write DQS output delay to align the write DQS to the middle of write DQ. PHY Write Data Eye Training State Machine 412 determines the best DRAM Vref voltage value for optimum write data eye. PHY Read Data Eye Training State Machine 416 performs a read data eye training algorithm to determine the best PHY Vref voltage value for optimum read data eye.

The PHY Data Macro is further described using an example Read Data Eye training. When the Read Data Eye Training is enabled, the PHY Data Macro receives a Training Control FSM that sends a memory write command to the Data Generation and Comparison Logic 400 which generates a known data pattern for output to DQ[7:0], DQS, and DQS# that is to be written to the DDR memory device 440. It is noted that the Write DQ Delay and Write DQS Delay values were previously calculated during a write data eye training. Accordingly, the Write DQ Delay and Write DQS Delay values have been properly determined so that the DQS is in the center of DQ at the DDR memory 440. Next, the Control FSM 400 sends a memory read command that instructs the Data Generation and Comparison Logic 404 to receive the read data and compare the read data with expected data. Initially the PHY Read Data Eye Training State Machine 416 drives a starting delay value on the Read DQS delay and a starting PHY Vref code. The DQ receiver Rx0 444 compares incoming read DQ voltage level with respect to Vref voltage value and generates either a high or a low signal to the data input of the Read Capture FIFO 408. The DQS differential receiver Rx1 446 receives read DQS and DQS# and generates a single ended Read DQS clock. The Variable Delay Line 448 delays the singled ended Read DQS clock based on input Read DQS Delay and the delayed DQS clock that were used to capture the read data. Data Generation and Comparison Logic 404 reads the data from Read Capture FIFO and compares the 16-bit Read Data with expected data. A comparison result based on a PASS/FAIL result is transferred to the PHY Read Data Eye Training State Machine. Based on the results, the FSM determines to increment or decrement the Read DQS Delay until the Read Data eye left and right end points are determined. Once the Read Data eye left and right end are determined, the PHY Read Data Eye Training State Machine 416 selects a next Vref Code and the entire Read Data Eye finding procedure is repeated for all valid Vref Code values. Finally, the best Vref Code which corresponds to a Vref voltage is chosen based on the Read data eye size.

Figure 6A:
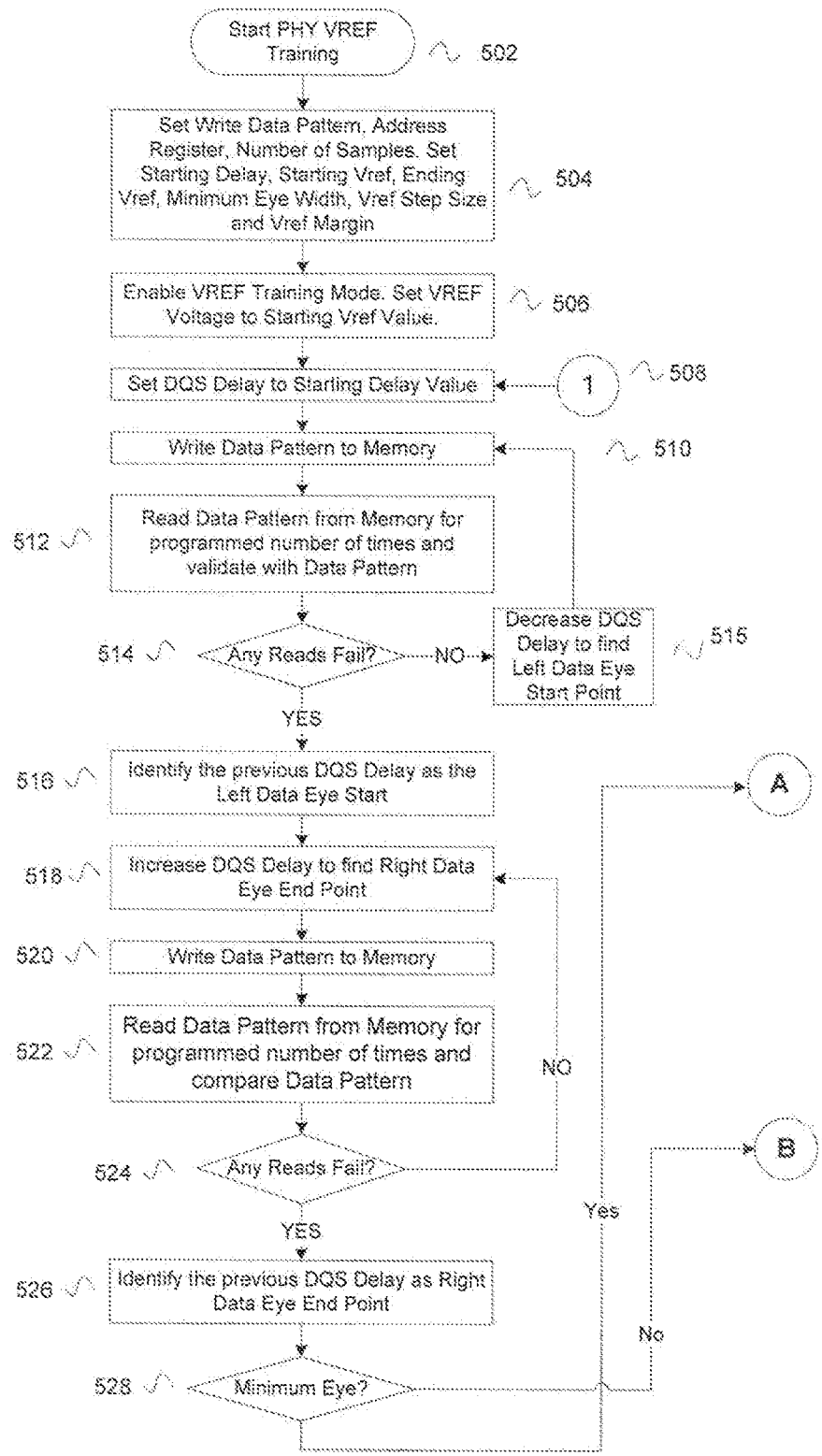
FIGS. 6A and 6B illustrate a flow diagram depicting data eye training for a DDR memory in accordance to an embodiment of the present invention.
Figure 6B:
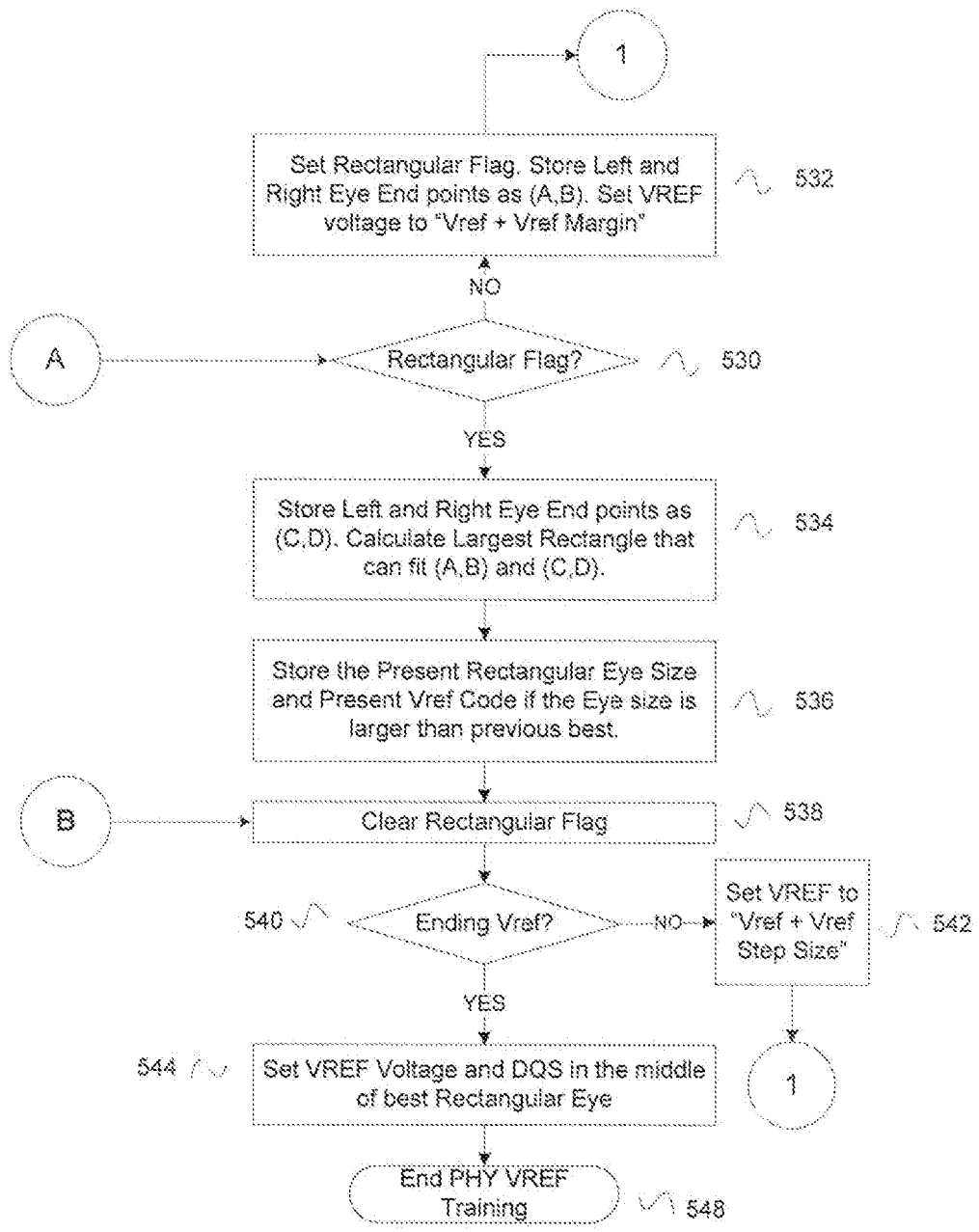

FIGS. 6A and 6B illustrate a flow diagram for DDR Memory training to determine an optimized rectangular data eye in accordance to an embodiment of the present invention. Referring first to FIG. 6A, the flow diagram begins with step 502 start PHY Vref Training. Next step 504, the PHY Vref Training is initialized with set write data pattern, address register, number of samples, starting delay, starting Vref voltage, ending Vref voltage, minimum eye width, Vref step size and Vref margin. In step 506, Vref training is enabled and PHY set Vref voltage to starting Vref voltage value. Step 508 sets DQS delay to starting delay value. In step 510, write data pattern to memory. Next step 512, read data pattern from memory for programmed number of times and compare data pattern. The read data is captured using the delayed DQS and the captured data is validated with the original data pattern. In decision step 514, if none of the multiple reads fail e.g. the captured data is validated with the original data pattern, the flow moves to step 515 in which, PHY instructs the Delay Line to decrease the Read DQS delay to find the Left Data Eye Start point and the flow returns to step 510. If any of the reads fail e.g. the captured data cannot be validated with the original data pattern in decision step 514, the flow moves to step 516 which stores the previous DQS delay value as Left Data Eye Start point.

Referencing back to FIG. 4, the Left Data Start point corresponds to reference "A" 308. Next step 518, PHY instructs Delay Line to increase DQS delay to find a right data eye end point. Step 520, PHY writes test data pattern to memory. In step 522, read data pattern from memory for programmed number of times and compare data pattern. The read data is captured using the delayed DQS and compared with the original test pattern. In decision step 524, if none of the multiple reads fail which represents that the captured read data is validated with the original test pattern, the flow moves to step 518 in which, PHY instructs the Delay Line to increase DQS delay value to find Right Data Eye End point. If any of the multiple reads fail which represents that the captured read data cannot be validated with the original test pattern, the flow moves to step 526 which stores the previous DQS delay value as the Right Data Eye End.

Referencing back to FIG. 4, the Right Data Eye End point corresponds to reference "B" 310. Accordingly, a lower line segment AB can be determined. Next step 528 is a decision step which compares the data eye width with minimum eye width. Minimum eye width indicates the minimum required data eye width needed. To reduce training time, if a data eye width for Vref meets the minimum eye width, then a data eye width at Vref+Vref Margin can be determined. Otherwise, determining a data eye width for Vref+Vref Margin is not necessary since the minimum requirements for the data eye width are not met at Vref. Also, if the data eye width for Vref+Vref Margin does not meet the minimum eye width, then the largest rectangle for the determined points A, B, C, and D are also not necessary since the minimum requirements for the data eye width are not met at Vref+Vref Margin.

Referring now to FIG. 6B, if the present eye width is less than a minimum eye width, then step 530 is performed to determine if rectangular flag is set. Otherwise, the flow moves to step 538 which clears rectangular flag. A rectangular flag value of zero or not set indicates present data eye width is calculated at Vref value. A rectangular flag value of 1 or set indicates present data eye width is calculated at Vref value+Vref margin.

When the rectangular flag value is zero or not set, the flow diagram moves to step 532 where the rectangular flag is set to a value 1 and Left Eye End point corresponding to reference "A" 308 and Right Eye End point corresponding to reference "B" 310 of FIG. 4 respectively, are saved. PHY also sets the Vref voltage to "present Vref value+Vref Margin value" in step 532. Next, the flow returns to step 508 where set DQS delay to starting delay value is performed again. Returning to decision step 530, in the alternative when the rectangular flag is set or has a high value such as 1, step 534 is performed. In step 534, store the present data Left Eye End point corresponding to reference "C" 312 and the present data Right Eye End point corresponding to reference "D" 314 to corresponding C and D registers. Accordingly, an upper segment CD can be determined. Step 534 calculates the largest rectangle (reference "A" 308, reference "B" 316, reference "D" 314, and reference "C" 318) that can fit between (reference "A" 308, reference "B" 310, reference "D" 314, and reference "C" 312) of FIG. 4. Next step 536, if the present rectangular eye width (point "A" 308, point "B" 316) is more than previously stored best data eye width, replace Vref value, best eye left start point and best eye right end point registers with present values, respectively. Step 538 clears rectangular flag to a value of zero. Next, decision step 540 determines if present Vref value is the Ending Vref value.

If the Ending Vref value is not reached, the flow moves to step 542 where PHY sets Vref voltage to next Vref value and the flow returns to step 508 where DQS delay is set to starting delay value. The next Vref value can be equal to the previous Vref value plus a Vref step size. The Vref step size is programmable and can be provided during initialization in step 504. The Vref values are iteratively increased for each pass through starting at step 542, where for each iterative pass the present rectangle area is stored if it is larger than the previous best (see step 536).

If the Ending Vref value is reached, the flow moves to step 544 where PHY sets Vref voltage to "best Vref value register+Vref Margin/2" and sets DQS delay in the middle of best eye left point and best eye right point register values for the largest rectangle. The ending Vref value is also programmable and provided during initialization. Step 548 ends PHY Vref training.

Accordingly, the DDR Memory training flow diagram calculates the rectangular data eye "A" 308, "B" 316, "D" 314, and "C" 318, within the overall data eye 305 that has optimal eye width and optimal Vref margin. In accordance to an embodiment of the present invention, the optimal delay for the DQS is such that a rising or falling edge of delayed DQS occurs in a portion of the data eye that has the most Vref margin as well as the most data eye width. The optimal Vref voltage for the rectangular data eye is Vref+Vref Margin/2. The foregoing flow diagram for DDR Memory training advantageously minimizes the numbers of registers that are used during the training to store intermediate results and minimizes the time needed to perform the optimized rectangular data eye determination.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A method of performing data eye training using a data pattern in a two dimensional space of time versus voltage for aligning a data strobe of a memory device, comprising the steps:
   validating the data pattern at a voltage reference ("Vref") to determine a lower segment AB;
   increasing the reference voltage by a margin voltage ("Vref+margin");
   validating the data pattern to determine an upper segment CD in the two dimensional space based on the increased Vref+margin;
   validating the data pattern to determine a second lower segment AB' in the two dimensional space;
   validating the data pattern to determine a second upper segment CD in the two dimensional space; and
   setting the data strobe to the middle of the second lower segment AB' and the second upper segment C'D,
   wherein the lower segment AB and the upper segment CD are within a data eye for the memory device, and
   wherein the second upper segment AB' and the second lower segment C'D form a largest rectangle within the lower segment AB and upper segment CD.

2. The method of claim 1, wherein the step of validating the data pattern to determine a lower segment AB' in the two dimensional space includes:
   validating the data pattern to determine a lower left data start point A in the two dimensional space; and
   validating the data pattern to determine a lower right data start point B' in the two dimensional space.

3. The method of claim 1, wherein the step of validating the data pattern to determine an upper lower segment C'D in the two dimensional space includes:

validating the data pattern to determine an upper left data start point C' in the two dimensional space based on the increased Vref+margin; and validating the data pattern to determine an upper right data start point D in the two dimensional space based on the increased Vref+margin.

4. The method of claim 1, wherein the second lower segment AB' defines a DQS timing margin within the rectangular data eye.

5. The method of claim 1, wherein the second upper segment C'D defines a DQS timing margin within the rectangular data eye.

6. The method of claim 1 wherein the largest rectangle is compared with a previous largest rectangle, wherein if the largest rectangle is greater in area than the previous largest rectangle, then the largest rectangle is stored as the previous largest rectangle.

7. The method of claim 6 wherein the data strobe is set to the middle of the previous largest rectangle.

8. The method of claim 1, in the validating the data pattern to determine the second upper segment step C'D, wherein if the increased Vref+margin is not equal to an ending reference voltage, then the increased Vref+margin is incremented by a reference voltage step size and wherein the method steps are repeated starting at the validating the data pattern to determine the upper segment CD using the incremented Vref+margin.

9. The method of claim 1 wherein the lower segment for the voltage reference Vref meets a minimum eye width within a data eye for the memory device.

10. The method of claim 1, in the validating the data pattern to determine the upper segment CD step, wherein if the upper segment CD does not meet a minimum eye width within a data eye for the memory device, then recurse back to and start at the increasing the reference voltage step.

* * * * *